(12) United States Patent
Gebreselasie et al.

(10) Patent No.: US 11,574,867 B2
(45) Date of Patent: Feb. 7, 2023

(54) NON-PLANAR SILICIDED SEMICONDUCTOR ELECTRICAL FUSE

(71) Applicant: GLOBALFOUNDRIES U.S. Inc., Santa Clara, CA (US)

(72) Inventors: Ephrem G. Gebreselasie, South Burlington, VT (US); Vibhor Jain, Williston, VT (US); Yves T. Ngu, Essex Junction, VT (US); Johnatan A. Kantarovsky, South Burlington, VT (US); Alain F. Loiseau, Williston, VT (US)

(73) Assignee: GlobalFoundries U.S. Inc., Santa Clara, CA (US)

(*) Notice: Subject to any disclaimer, the term of this patent is extended or adjusted under 35 U.S.C. 154(b) by 121 days.

(21) Appl. No.: 17/104,078

(22) Filed: Nov. 25, 2020

(65) Prior Publication Data

US 2022/0165663 A1    May 26, 2022

(51) Int. Cl.
*H01L 23/52*       (2006.01)
*H01L 23/525*      (2006.01)
*H01L 21/8249*     (2006.01)
*H01L 21/02*       (2006.01)
*H01L 27/07*       (2006.01)
*H01L 23/62*       (2006.01)
*H01L 27/115*      (2017.01)
*H01L 27/112*      (2006.01)
*H01L 27/02*       (2006.01)

(52) U.S. Cl.
CPC .... *H01L 23/5256* (2013.01); *H01L 21/02532* (2013.01); *H01L 21/8249* (2013.01); *H01L 23/62* (2013.01); *H01L 27/0288* (2013.01); *H01L 27/0711* (2013.01); *H01L 27/115* (2013.01); *H01L 27/11206* (2013.01)

(58) Field of Classification Search
CPC .. H01L 27/11206; H01L 27/115; H01L 23/62; H01L 27/0288; H01L 21/76888; H01L 27/11521; H01L 27/11526; H01L 23/5283; H01L 23/5256; H01L 21/02532; H01L 21/8249; H01L 27/0711; H01L 27/0635; H01L 27/0617
See application file for complete search history.

(56) References Cited

U.S. PATENT DOCUMENTS 7,545,253 B2    6/2009  Hsu et al.
7,777,297 B2    8/2010  Yang et al.
7,800,181 B2 *  9/2010  Okuno .............. H01L 21/28052
                                              257/411

(Continued)

*Primary Examiner* — Shouxiang Hu
(74) *Attorney, Agent, or Firm* — Francois Pagette; Hoffman Warnick LLC

(57) ABSTRACT

An electrical fuse (e-fuse) includes a fuse link including a silicided semiconductor layer over a dielectric layer covering a gate conductor. The silicided semiconductor layer is non-planar and extends orthogonally over the gate conductor. A first terminal is electrically coupled to a first end of the fuse link, and a second terminal is electrically coupled to a second end of the fuse link. The fuse link may be formed in the same layer as an intrinsic and/or extrinsic base of a bipolar transistor. The gate conductor may control a current source for programming the e-fuse. The e-fuse reduces the footprint and the required programming energy compared to conventional e-fuses.

19 Claims, 9 Drawing Sheets

(56) References Cited

U.S. PATENT DOCUMENTS

| | | | |
|---|---|---|---|
| 7,923,811 B1* | 4/2011 | Im | H01L 23/5256 257/209 |
| 8,530,319 B2 | 9/2013 | Gebreselasie et al. | |
| 2010/0164603 A1* | 7/2010 | Hafez | G11C 17/16 257/E29.001 |
| 2016/0035735 A1* | 2/2016 | Hafez | H01L 23/5252 257/50 |
| 2017/0084620 A1* | 3/2017 | Wu | H01L 23/5252 |

\* cited by examiner

NON-PLANAR SILICIDED SEMICONDUCTOR ELECTRICAL FUSE

BACKGROUND

The present disclosure relates to integrated circuits, and more specifically, to a non-planar silicided semiconductor electrical fuse.

Different parts of an integrated circuit (IC) may be coupled using an electrical fuse (e-fuse). E-fuses can be 'programmed' to change interconnections within the IC. More particularly, metal within the fuse link can be caused to migrate by application of a prescribed current controlled by a transistor. Once sufficient metal has migrated, the fuse link is open or blown, stopping current from passing through the fuse. One challenge presented by electrical fuses is that they occupy a large footprint in ICs due to the size of the fuse and the associated current source needed to program them. Electrical fuses also include a planar fuse link that has a large footprint. Typically, the size of the e-fuse is limited by the size of the gate conductors within a particular technology node. Accordingly, one approach to reduce the size of e-fuses includes reducing the fuse link size to the minimum gate conductor length allowed by a technology node.

SUMMARY

An aspect of the disclosure includes an electrical fuse (e-fuse), comprising: a fuse link including a silicided semiconductor layer over a dielectric layer covering a gate conductor, wherein the silicided semiconductor layer is non-planar; a first terminal electrically coupled to a first end of the fuse link; and a second terminal electrically coupled to a second end of the fuse link.

An aspect of the disclosure related to an integrated circuit (IC), comprising: a bipolar transistor including an intrinsic base and an extrinsic base; a complementary metal-oxide semiconductor (CMOS) transistor; and an electrical fuse (e-fuse), including: a non-planar fuse link including a silicided semiconductor layer over a dielectric layer covering a gate conductor, wherein the silicided semiconductor layer extends orthogonally over the gate conductor; a first terminal electrically coupled to a first end of the non-planar fuse link; and a second terminal electrically coupled to a second end of the non-planar fuse link, wherein the silicided semiconductor layer is a same layer as at least one of the intrinsic base and the extrinsic base of the bipolar transistor.

Another aspect of the disclosure is directed to a method, comprising: forming a semiconductor layer for at least one of an intrinsic base and an extrinsic base for a bipolar transistor, and over a dielectric layer over a gate conductor; patterning the semiconductor layer to extend orthogonally over the gate conductor; forming a fuse link for an electrical fuse by siliciding the semiconductor layer over the dielectric layer over the gate conductor, wherein the silicided semiconductor layer is non-planar over the gate conductor; and forming the electrical fuse by forming a first terminal electrically coupled to a first end of the fuse link, and a second terminal electrically coupled to a second end of the fuse link.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
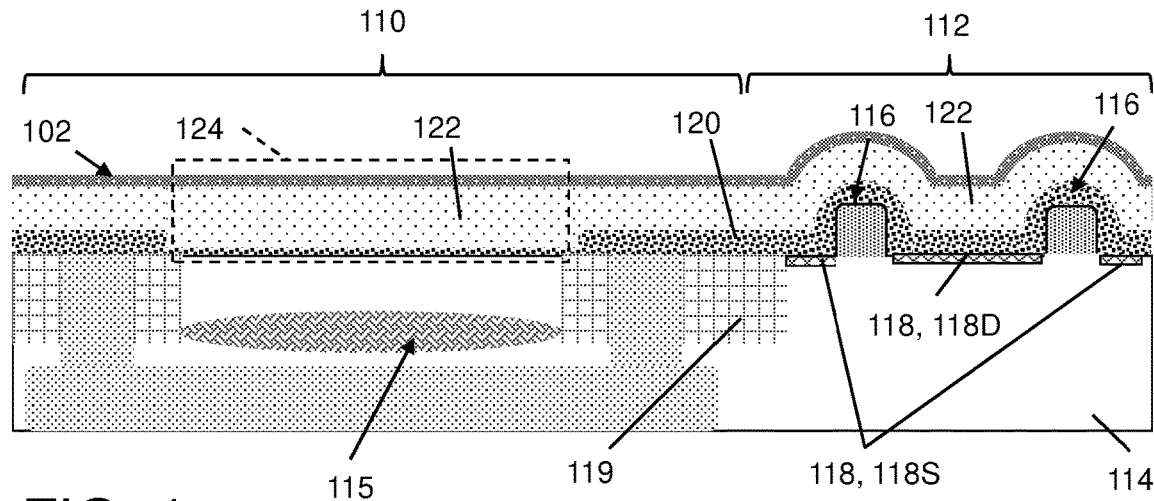
FIGS. 1-2 show cross-sectional views of forming an electrical fuse (e-fuse), according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide an electrical fuse (e-fuse) that includes a fuse link including a silicided semiconductor layer over a dielectric layer covering a gate conductor. Hence, the fuse link is electrically isolated from the gate conductor therebelow. The silicided semiconductor layer is non-planar and extends orthogonally over the gate conductor. The non-planar fuse link provides greater length in a smaller footprint compared to conventional planar e-fuses. Additionally, the length of the fuse link can be customized based on, for example, the height of the gate conductor and dielectric layer, how many gate conductors it passes over, and the number of times it passes over the gate conductor(s). A first terminal is electrically coupled to a first end of the fuse link, and a second terminal is electrically coupled to a second end of the fuse link. The semiconductor fuse link may be conveniently formed in the same layer as an intrinsic and/or extrinsic base of a bipolar transistor during bipolar complementary metal-oxide semiconductor (BiCMOS) fabrication, thus requiring no additional processing steps to build. The gate conductor may be part of a transistor that controls a current source for programming the e-fuse, which further reduces the footprint compared to conventional e-fuses by placing the control transistor at least partially under the fuse link. The e-fuse also requires less programming energy compared to conventional e-fuses.

Figure 2:
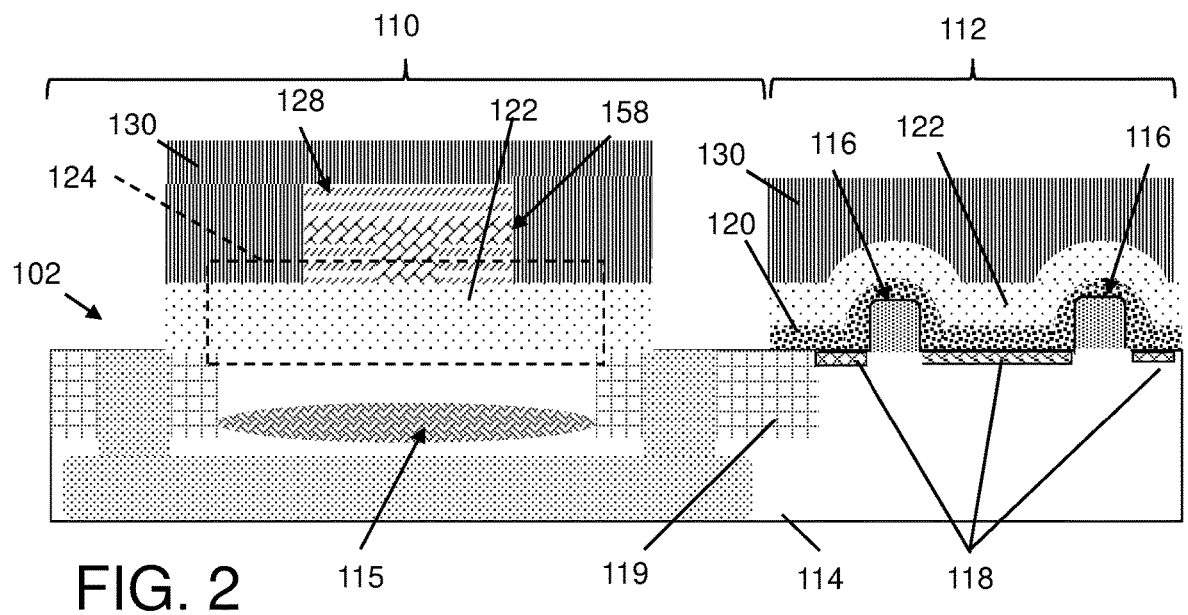

FIGS. 1 and 2 show enlarged cross-sectional views of a method of forming parts of an IC 102 including an electrical fuse (e-fuse) 100, according to embodiments of the disclosure. As illustrated, in one embodiment, IC 102 includes a bipolar transistor region 110 and a complimentary metal-oxide semiconductor (CMOS) transistor region 112. E-fuse 100 will be built in CMOS transistor region 112, but may be built simultaneously with parts of bipolar transistor region 110. Alternatively, where IC 102 does not include bipolar transistor region 110, e-fuse 100 may be built exclusively within a CMOS transistor region 112. A substrate 114 upon which the regions are built may include any now known or later developed semiconductor substrate, e.g., a bulk substrate, or a semiconductor-on-insulator (SOI) substrate.

At this stage, bipolar transistor region 110 includes n-type or p-type implant region 115 to form the various parts of a bipolar transistor, like a collector in this example. As this structure and the methods of forming it are known in the art, no further description is warranted. CMOS transistor region 112 may include source/drain regions 118 formed in substrate 114 in any known fashion, e.g., implanting of any appropriate dopants. In one example, source regions 118S for gate conductors 116 have drain region 118D separated therefrom by respective channel regions (not numbered for clarity—under gate conductors 116). Any necessary trench isolations 119 may also be provided and may be formed in any now known or later developed fashion, e.g., etching holes in substrate 114 prior to gate conductor 116 formation and filling with a dielectric such as oxide.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features, such as trench isolation trenches.

CMOS transistor region 112 includes a number of gate conductors 116 formed thereon. In the example shown in FIGS. 1-4, two gate conductors 116 are illustrated. As will be described herein, more or less gate conductors 116 are also possible. In the example shown in FIGS. 1-2, gate conductors 116 are in an active region of CMOS transistor region 112, and thus are used as active gates. In this case, in one non-limiting example, gate conductor(s) 116 may include polysilicon. In another example, gate conductor(s) 116 may include a metal gate. Although shown as a single material for clarity, metal gates may include one or more conductive components for providing a gate terminal of a transistor. For example, metal gates may include a high dielectric constant (high-K) layer, a work function metal layer and a conductor layer (not all shown for clarity). The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The conductor layer may include any now known or later developed gate conductor such as copper (Cu). A gate cap (not shown) of, for example, a nitride may also be formed over the gate region. Gate conductor 116 may also include a spacer (not shown) thereabout, e.g., of silicon nitride. Gate conductor 116 may be formed using any now known or later developed IC fabrication technique over substrate 114, e.g., material deposition, photolithographic patterning using masks and etching, etc. In other embodiments, as will be described, gate conductor(s) 116 may not be active gate(s), and may include other materials than listed above.

FIG. 1 also shows forming a semiconductor layer 122 over gate conductor(s) 116 for CMOS transistor region 112 and, if bipolar transistor region 110 is present, for creating at least one of an intrinsic base and an extrinsic base (within dashed box 124) for bipolar transistor region 110. FIG. 1 also shows forming a dielectric layer 120 over gate conductor(s) 116. Semiconductor layer 122 and dielectric layer 120 may be formed by any appropriate deposition technique. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Semiconductor layer 122 and dielectric layer 120 may be formed, for example, by ALD. A mask may be used to block deposition of dielectric layer 120 over bipolar transistor region 110, or dielectric layer 120 may be etched off region 110. It will recognized that the processing illustrated for CMOS transistor region 112 can be performed without the processing shown relative to bipolar transistor region 110, i.e., where no bipolar transistors are present in IC 102.

Semiconductor layer 122 may include, for example, silicon (Si) or silicon germanium (SiGe). As noted, semiconductor layer 122 may be the same layer as that is used to form an intrinsic base and/or an extrinsic base (in dashed box 124) of bipolar transistor region 110. In this case, semiconductor layer 122 may include a dopant concentration of greater than 5E18 atoms/cm$^3$. The dopant may be any appropriate element for the polarity type of the base(s) of a bipolar transistor 158 (FIG. 2) to be formed in region 110. N-type dopants are elements introduced to semiconductor to generate free electron (by "donating" electron to semiconductor), and must have one more valance electron than semiconductor; common donors in silicon (Si): phosphorous (P), arsenic (As), antimony (Sb) and in gallium arsenic (GaAs): sulphur (S), selenium (Se), tin (Sn), silicon (Si), and carbon (C). P-type dopants are elements introduced to semiconductor to generate free hole (by "accepting" electron from semiconductor atom and "releasing" hole at the same time); acceptor atom must have one valence electron less than host semiconductor. P-type dopants: may include but are not limited to: boron (B), indium (In) and gallium (Ga).

Dielectric layer 120 may include any suitable dielectric material including but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectricals, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). Here, for example, dielectric layer 120 may include a high temperature oxide (HTO). It is noted that, regardless of form, gate conductor 116 is covered by dielectric layer 120, and therefore generally electrically isolated from structure thereover.

Figure 4:
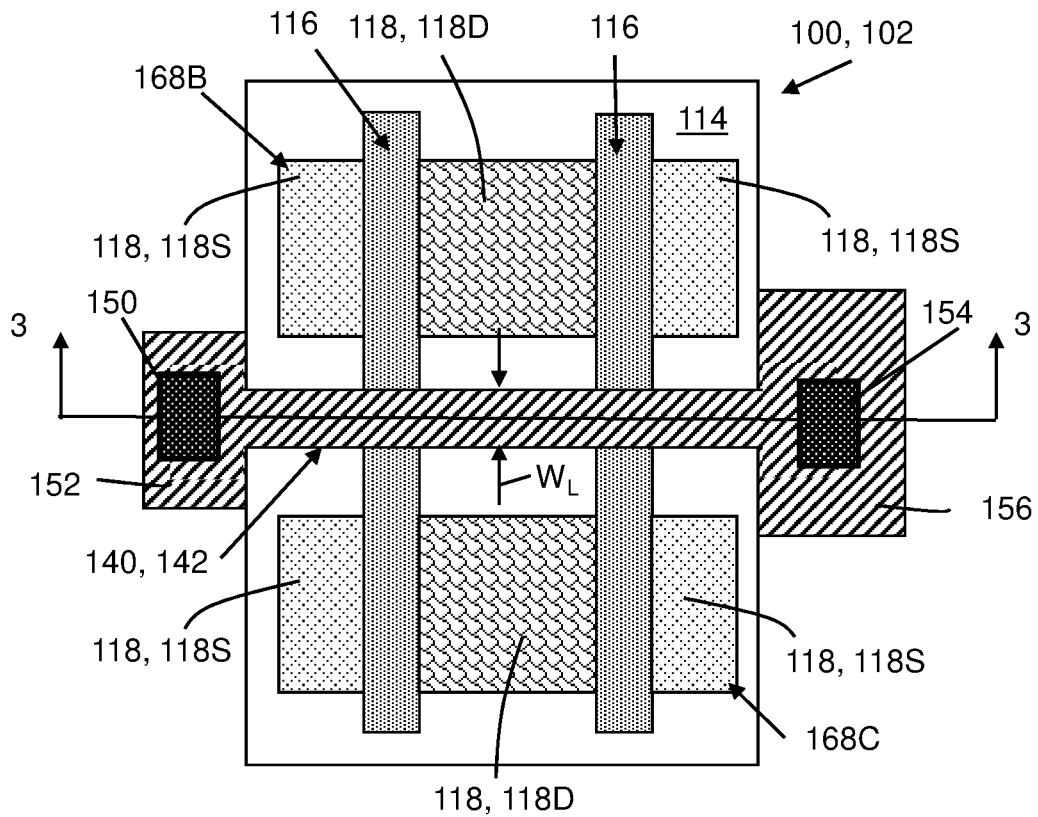
FIG. 4 shows a plan view of the e-fuse of FIG. 3.

FIG. 2 shows patterning semiconductor layer 122 to extend orthogonally over gate conductor(s) 116—see also, the plan view of FIG. 4. This step is shown after a number of intervening steps to form emitter 128 in bipolar transistor region 110. These intervening steps may include any now known or later developed techniques, and thus will be not be described in further detail. As shown, a mask 130 may be formed and patterned to allow patterning of semiconductor layer 122. Where bipolar transistor region 110 is provided, mask 130 may also be used to pattern parts of intrinsic and/or extrinsic base (within dashed box 124). Any appropriate masking and etching process may be used to pattern semiconductor layer 122, e.g., a silicon nitride hardmask and etching. FIG. 4 shows one embodiment of fuse link 140 including the semiconductor layer (after silicidation) extending orthogonally over gate conductor(s) 116. Here, a RIE may be used, for example, to pattern the semiconductor layer.

Figure 3:
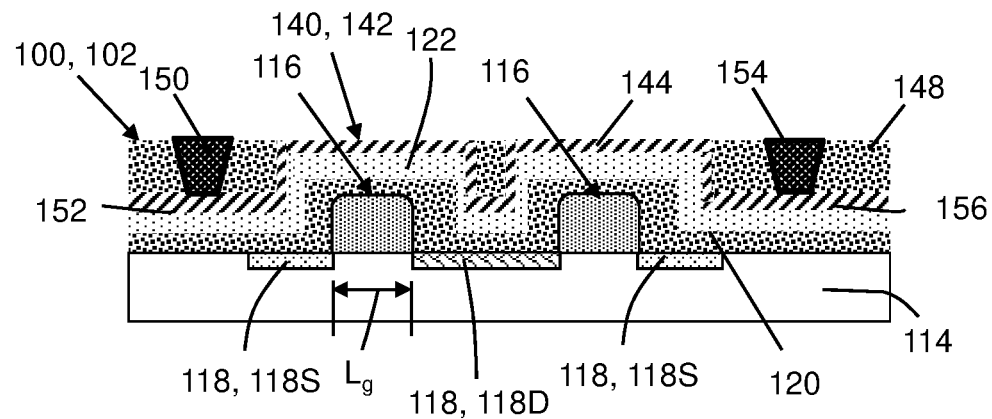
FIG. 3 shows an enlarged cross-sectional view of an e-fuse with a non-planar fuse link of silicided semiconductor, according to embodiments of the disclosure.

FIG. 3 shows a cross-sectional view of forming a fuse link 140 for e-fuse 100 by siliciding semiconductor layer 122 over dielectric layer 120 over gate conductor(s) 116. FIG. 4 shows a schematic plan view of e-fuse 100 with a view line 3-3 indicating the cross-sectional view provided by FIG. 3. FIGS. 3 and 4 omit bipolar transistor region 110 (FIGS. 1-2) for clarity. The silicidation process forms a silicided semiconductor layer 142 including semiconductor layer 122 of silicon (Si) or silicon germanium (SiGe), having silicide layer 144 thereon. Hence, fuse link 140 includes silicided semiconductor layer 142 with semiconductor layer 122 and silicide layer 144. Silicide layer 144 may be formed using any now known or later developed technique, e.g., performing an in-situ pre-clean, depositing a metal such as titanium, nickel, cobalt, etc., annealing to have the metal react with semiconductor layer 122, and removing unreacted metal. While shown along all of the length of fuse link 140, silicide layer 144 may be only along a portion of fuse link 140. FIG. 3 also shows silicided semiconductor layer 142 (fuse link 140) is non-planar over gate conductor(s) 116. That is, it includes peaks and valleys as the layer extends over gate conductor(s) 116.

FIGS. 3 and 4 also show forming (finalizing) e-fuse 100 by forming a first terminal 150 electrically coupled to a first end 152 of fuse link 140, and a second terminal 154 electrically coupled to a second end 156 of fuse link 140. Terminals 150, 154 are on opposite sides of gate conductor(s) 116. Terminals 150, 154 may be formed using any now known or later developed electrical interconnect forming processes. In one non-limiting example, an interlayer dielectric (ILD) 148 (FIG. 3) may be deposited (e.g., using ALD). ILD 148 may include any dielectric listed previously herein for dielectric layer 120. Terminals 150, 154 may be formed by patterning a mask, and etching terminal openings to the respective ends 152, 156 of fuse link 140, e.g., using a RIE. Ends 152, 156, as shown in FIG. 4, may be patterned during semiconductor layer 122 patterning, as described herein, to be enlarged compared to the rest of fuse link 140 to provide a landing area for terminals 150, 154. A conductor can then be formed in the terminal openings. The conductor may include refractory metal liner, and a terminal metal. The refractory metal liner (not labeled for clarity) may include, for example, ruthenium (Ru), tantalum (Ta), titanium (Ti), tungsten (W), iridium (Jr), rhodium (Rh) and platinum (Pt), etc., or mixtures thereof. The terminal metal may include any now known or later developed conductor such as but not limited to copper (Cu) or tungsten (W).

E-fuse 100 includes fuse link 140 including silicided semiconductor layer 142 over dielectric layer 120 covering gate conductor 116. E-fuse 100 also includes first terminal 150 electrically coupled to first end 152 of fuse link 140, and second terminal 154 electrically coupled to second end 156 of fuse link 140. As noted, silicided semiconductor layer 142 may be in a same layer as at least one of an intrinsic base and an extrinsic base (dashed box 124 (FIG. 2)) of bipolar transistor 158 (FIG. 2). Gate conductor(s) 116 is covered by dielectric layer 120 and is free of silicide under dielectric layer 120 under silicided semiconductor layer 122.

Fuse link 140 is configured, i.e., shaped and/or dimensioned, to allow metal or metal alloy migration upon application of the appropriate current applied through terminals 150, 154 to open fuse link 140, i.e., to control a programing energy to open or blow the fuse. For example, fuse link 140 may be formed to have any desired length $W_L$ (FIG. 4), e.g., during patterning of semiconductor layer 122 (FIG. 2).

A length of fuse link 140 can also be controlled in a number of ways during fabrication to generate e-fuse 100 with a desired programming energy. Since silicided semiconductor layer 142 of fuse link 140 extends orthogonally over gate conductor(s) 116, the silicided semiconductor layer 142 and fuse link 140 are non-planar and a length thereof can be controlled by controlling a length and/or height of gate conductor(s) 116 and/or dielectric layer 120. For example, the height of gate conductor(s) 116 and a thickness of dielectric layer 120 can be controlled to customize the length of fuse link 140 required to pass thereover. Alternatively, a length $L_g$ (FIG. 3) of gate conductor(s) 116 can be controlled to change the length of fuse link 140.

Figure 5:
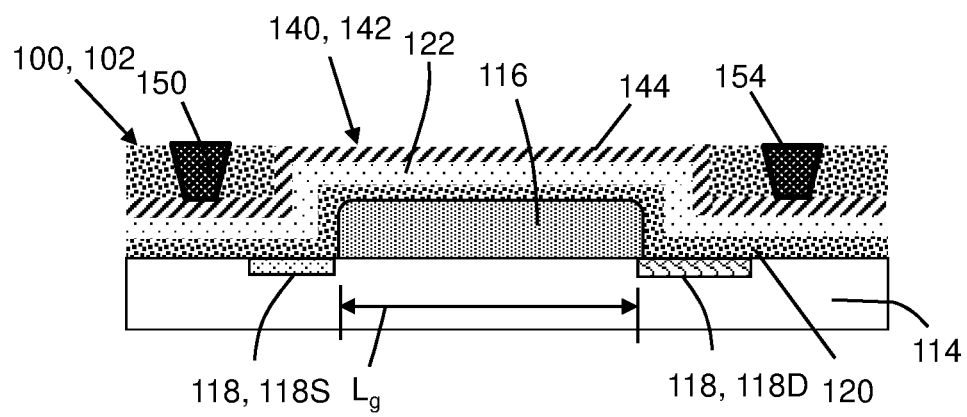
FIG. 5 shows a cross-sectional view of an e-fuse with a non-planar fuse link of silicided semiconductor, according to other embodiments of the disclosure.
Figure 6:
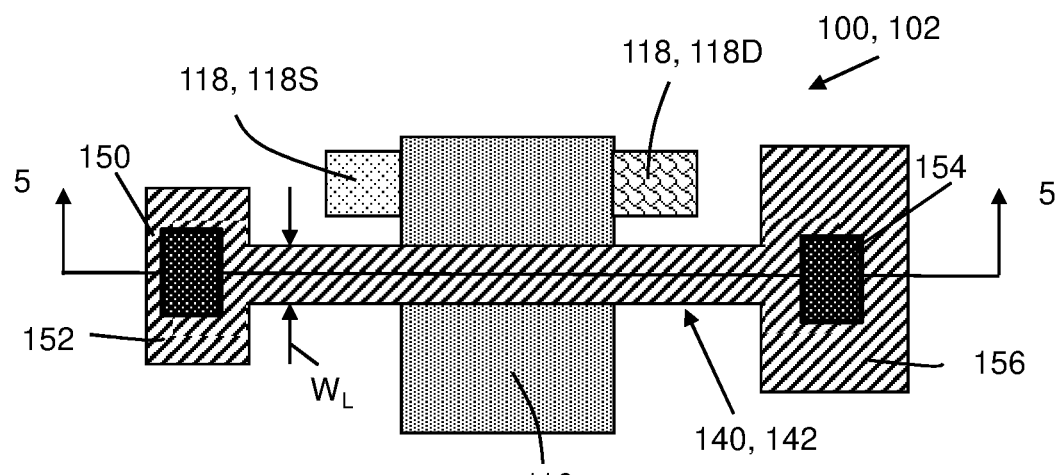
FIG. 6 shows a plan view of the e-fuse of FIG. 5.
Figure 7:
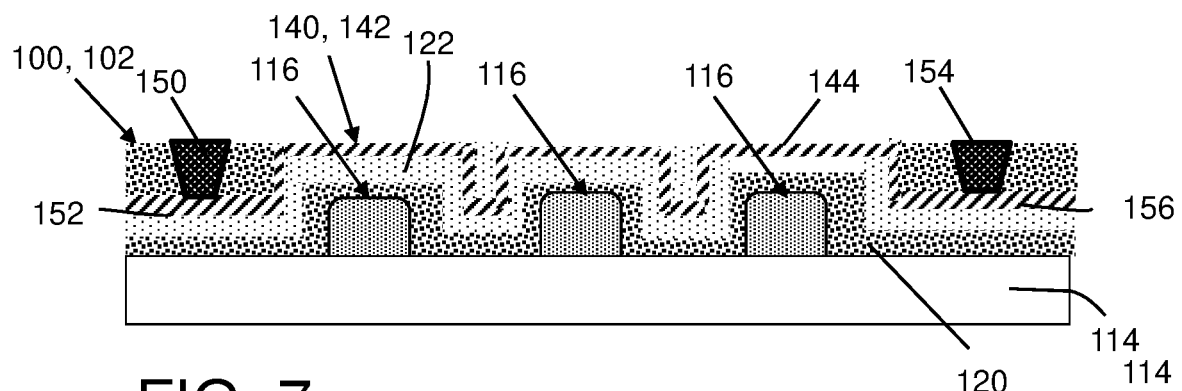
FIG. 7 shows a cross-sectional view of an e-fuse with a non-planar fuse link of silicided semiconductor, according to yet other embodiments of the disclosure.
Figure 8:
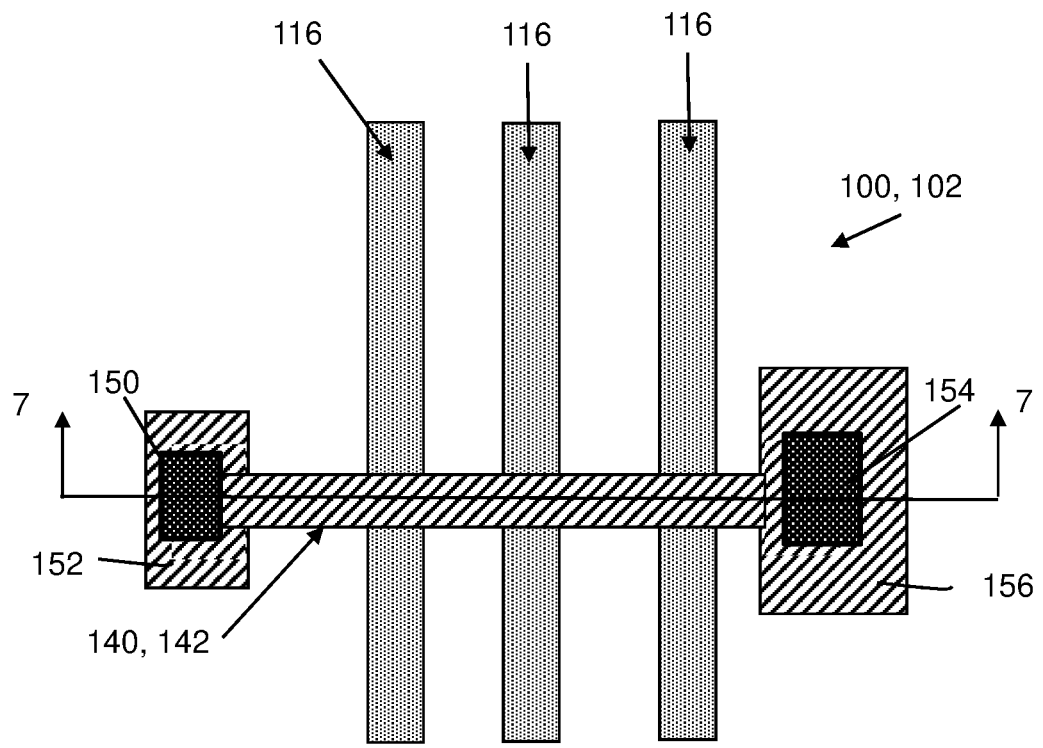
FIG. 8 shows a plan view of the e-fuse of FIG. 7.

The number of gate conductors 116 may also be selected to customize the length of fuse link 140. In FIGS. 3 and 4, two gate conductors 116 are illustrated. However, any number of gate conductors 116 may be provided. Thus, fuse link 140 may include silicided semiconductor layer 142 over dielectric layer 120 covering a plurality of gate conductors 116 such that the non-planar fuse link includes any number of peaks and valleys. One gate conductor 116 or more than two gate conductors 116 may be used. FIG. 5 shows a cross-sectional view and FIG. 6 shows a schematic plan view (with view line 5-5 indicating the cross-sectional view line of FIG. 5) of e-fuse 100 with one gate conductor 116. Here, for example, a length Lg and/or height of gate conductor 116 and dielectric layer 120 can be fabricated to control a length of fuse link 140. FIG. 7 shows a cross-sectional view and FIG. 8 shows a schematic plan view (with view line 7-7 indicating the cross-sectional view of FIG. 7) of e-fuse 100 with more than two gate conductors 116. A length Lg and/or a height of each gate conductor 116 and/or dielectric layer 120 can also be selected to control a length of fuse link 140. Any number of a number of peaks and valleys in fuse link 140 can be formed in this manner.

Figure 9:
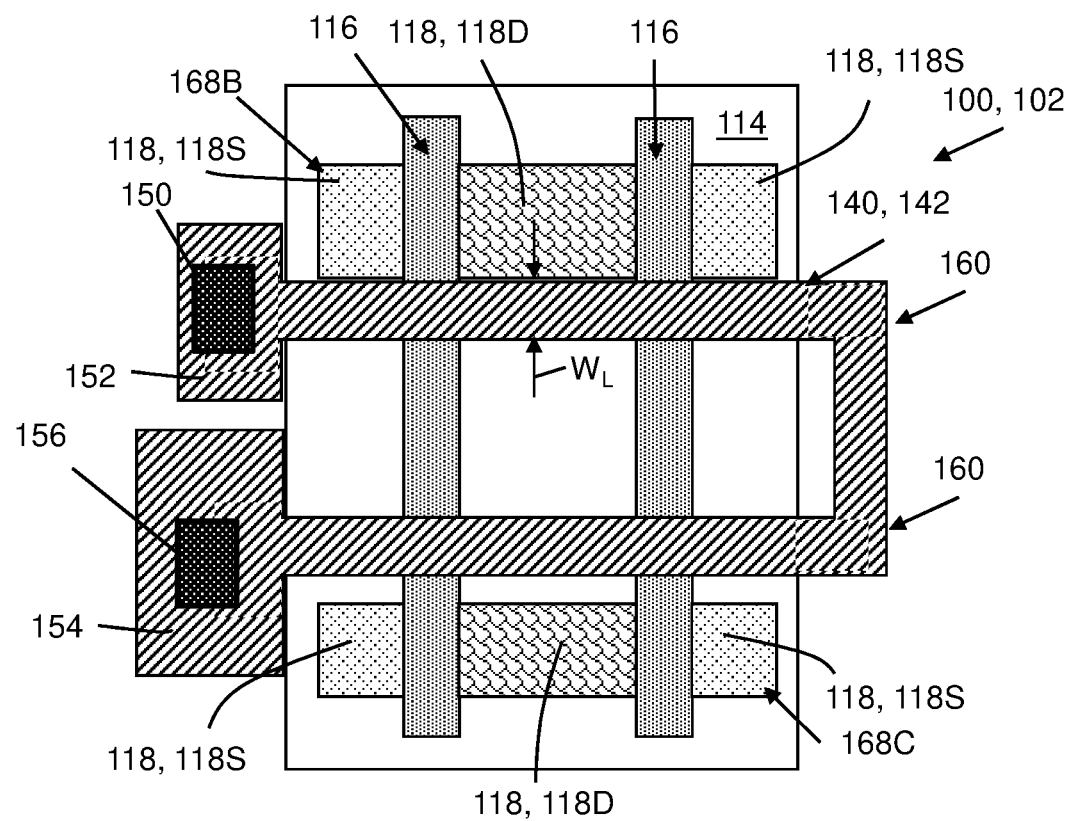
FIG. 9 shows a plan view of an e-fuse with a non-planar fuse link with a turn(s), according to embodiments of the disclosure.
Figure 10:
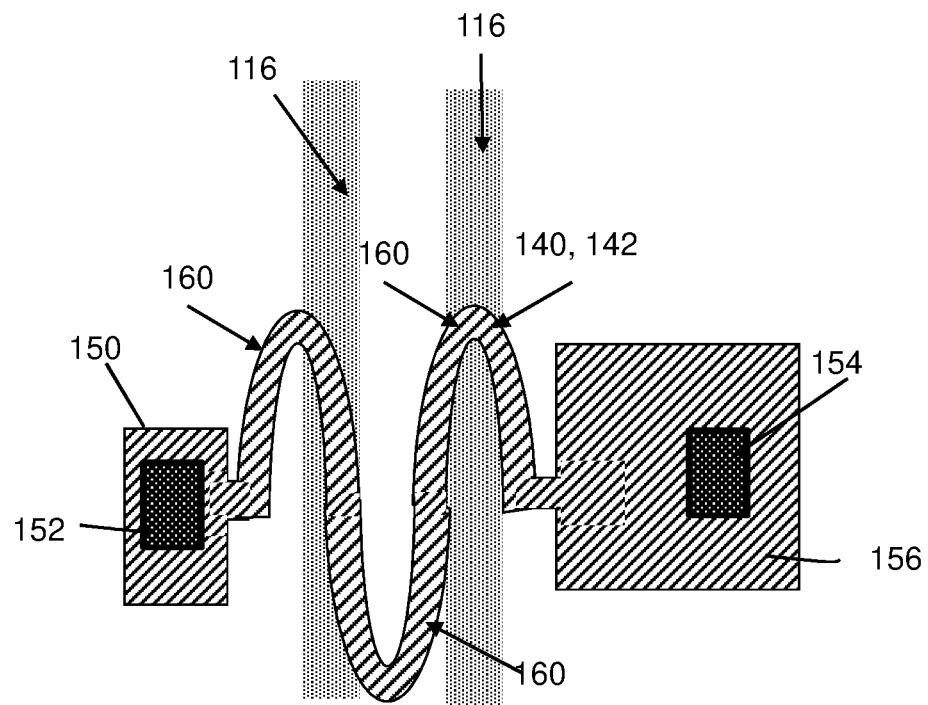
FIG. 10 shows a plan view of an e-fuse with a non-planar fuse link with a turn(s), according to other embodiments of the disclosure.
Figure 11:
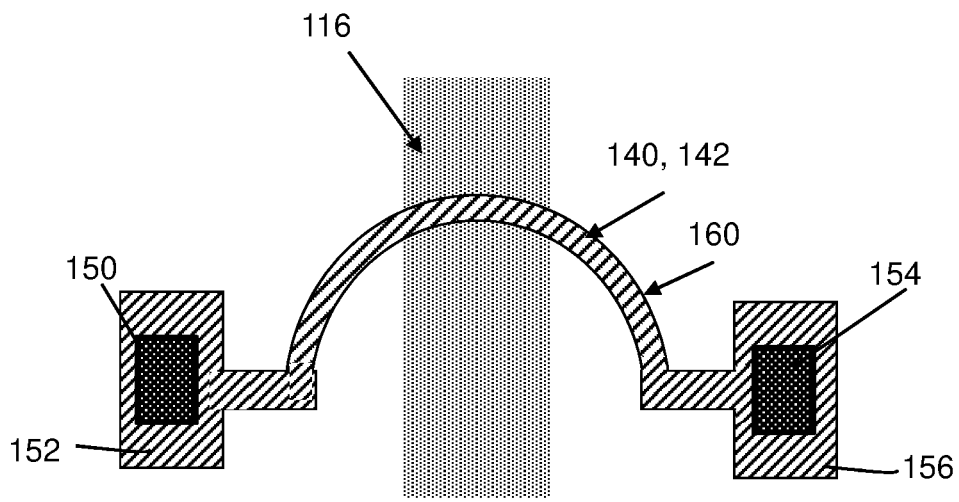
FIG. 11 shows a plan view of an e-fuse with a non-planar fuse link with a turn(s), according to yet other embodiments of the disclosure.

As shown in FIGS. 9-11, a length of fuse link 140 can also be controlled by providing fuse link 140 with at least one lateral turn 160 therein. In this manner, the length of fuse link 140 can be selected by the number of times fuse link 140 passes over gate conductor(s) 116, and the additional length provided by turn(s) 160. Here, fuse link 140 generally extends orthogonally over gate conductor(s) 116 more than once, but can have some extent that may not be orthogonal. For example, FIG. 9 shows a plan view of fuse link 140 extending orthogonally over gate conductor(s) 116 twice, e.g., with one or two turns 160 therein. FIGS. 10 and 11 show plan views of two other alternative embodiments including various turns 160 therein. FIG. 10 shows e-fuse 100 with non-planar fuse link 140 having a laterally sinusoidal configuration, and FIG. 11 shows e-fuse 100 with non-planar fuse link 140 having a curved central portion. Turns 160 may be in any desired number, and/or may take any conceivable shape(s), to attain the desired programming energy. As illustrated in FIGS. 10 and 11, in certain embodiments, fuse link 140 may extend at a non-orthogonal angle over gate conductor(s) 116. Turn(s) 160 allow for the area of fuse link 140 to be minimized.

Figure 12:
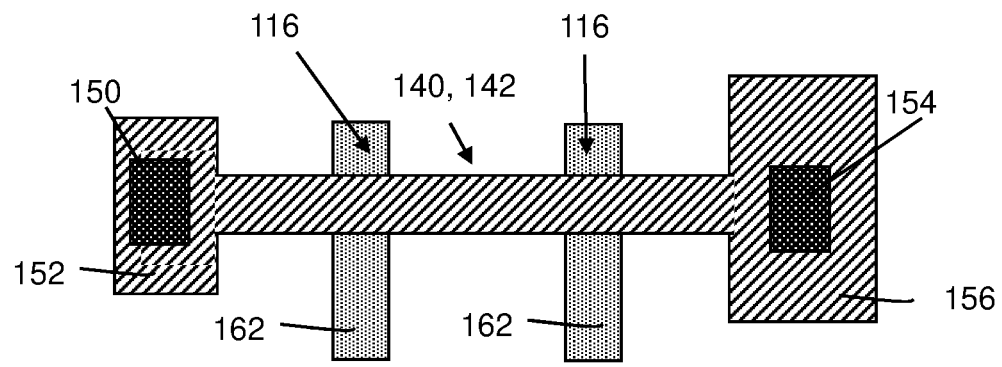
FIG. 12 shows a plan view of an e-fuse with a non-planar fuse link, according to embodiments of the disclosure.

Referring to FIGS. 7, 8 and 12, plan views of alternative embodiments are illustrated. In certain embodiments, gate conductor(s) 116 may not act as part of active device(s). For example, as shown in FIGS. 7, 8 and 12, gate conductor(s) 116 may be non-operational, meaning they do not have any source/drain regions nor any active device connections thereto. In this case, gate conductor(s) 116 may include in addition to the materials listed previously herein, any dummy gate material, e.g., amorphous silicon, or any other appropriate dummy gate material. In other embodiments, gate conductor(s) 116 may be a resistor(s) 162 (see e.g., FIG. 12). In this case, gate conductor(s) 116 may act to heat e-fuse 100 to control the programming energy. When connected to a supply, gate conductor(s) 116 will generate heat depending on the resistance value, which may reduce the programming energy needed for the fuse.

Figure 13:
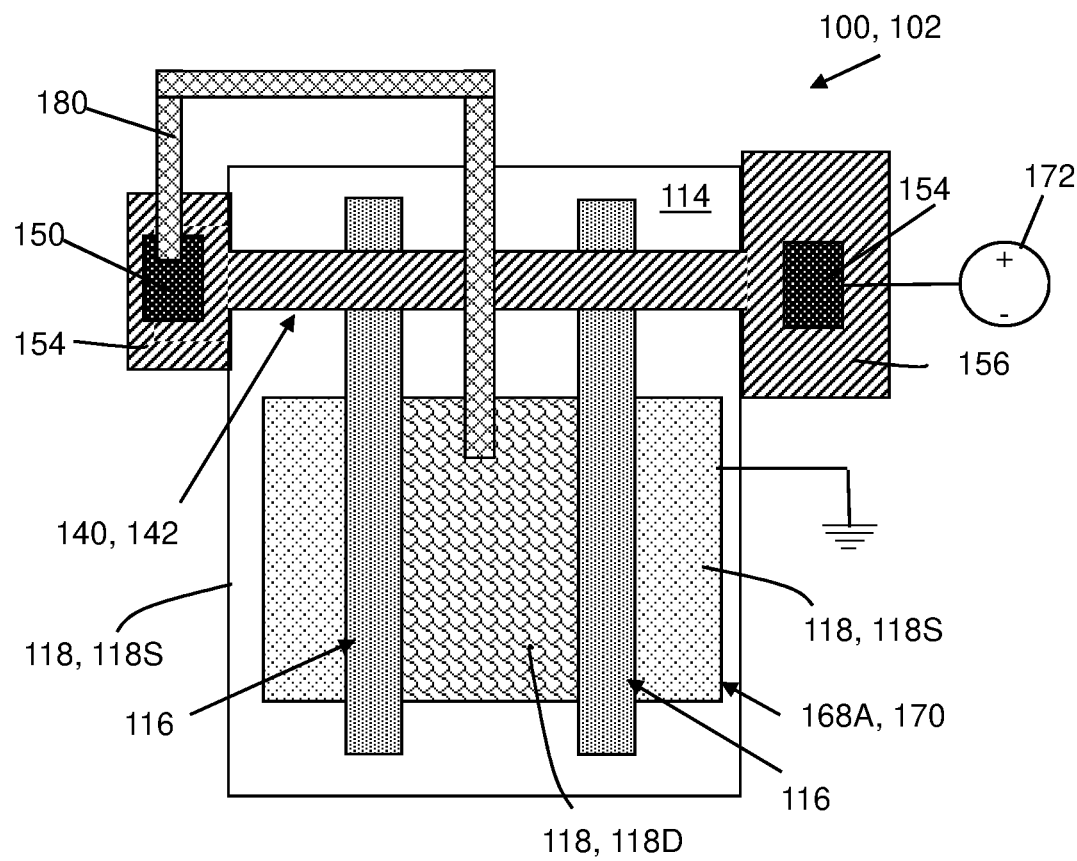
FIG. 13 shows a plan view of an e-fuse with a non-planar fuse link and a control transistor, according to embodiments of the disclosure.
Figure 14:
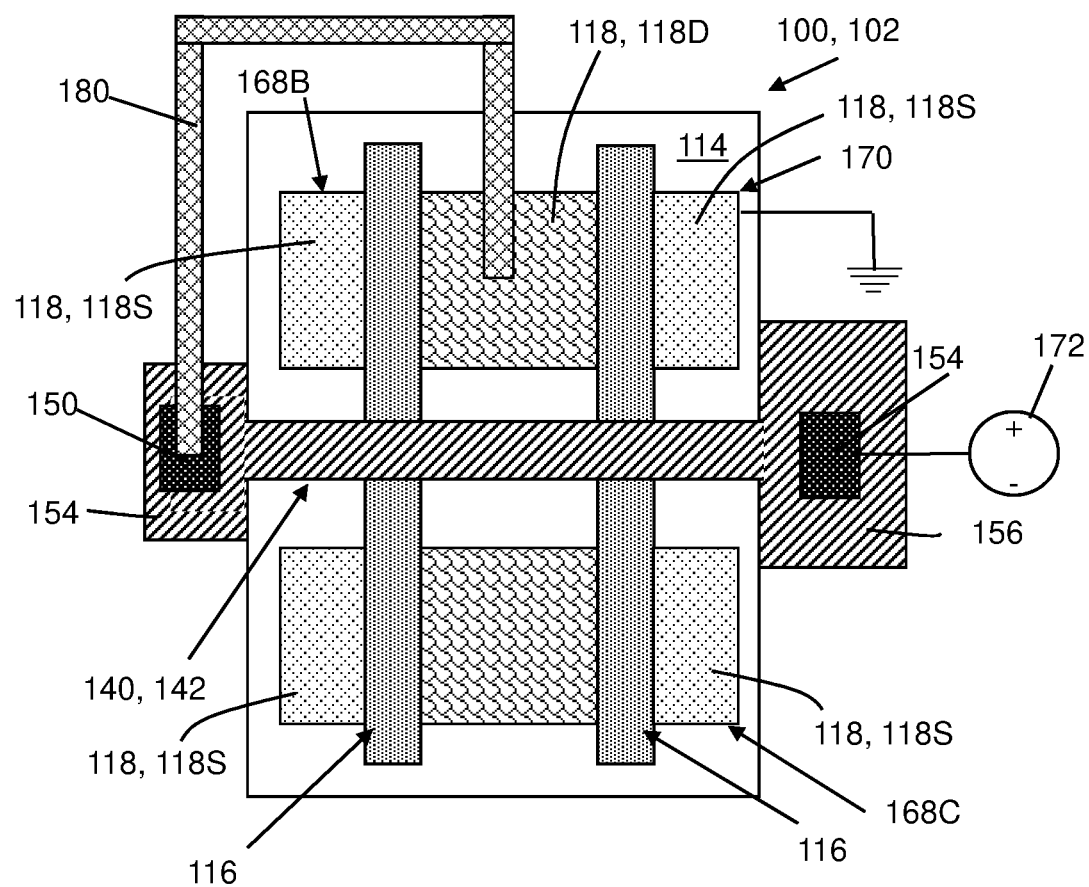
FIG. 14 shows a plan view of an e-fuse with a non-planar fuse link and a control transistor, according to other embodiments of the disclosure.

Referring to FIGS. 13-14, schematic plan views of other embodiments of e-fuse 100 are illustrated. A position of fuse link 140 relative to gate conductor(s) 116 may also be varied to control programming energy. For example, one may select the location of fuse link 140 over gate conductor(s) 116 to obtain a lowest programming energy. The selected location might not be a center of gate conductor(s) 116. For example, in FIG. 13, fuse link 140 is adjacent an active transistor 168A and not at a center of gate conductor(s) 116. In FIGS. 4, 9 and 14, fuse link 140 is between active transistors 168B, C that share gate conductors 116, and is generally centered along gate conductor(s) 116. In another embodiment, where other structure does not prohibit, for example as in FIG. 8, fuse link 140 can be anywhere along lengths of gate conductors 116.

Referring to FIGS. 13-14, in certain embodiments, gate conductor 116 may be part of a control transistor 170 configured to electrically couple a current source 172 to first terminal 150 for programming e-fuse 100 with second terminal 154 electrically coupled to ground. In one embodiment, gate conductor(s) 116 may be part of a CMOS control transistor 170, and the CMOS transistor may be configured to electrically couple current source 172 to non-planar fuse link 140 for programming e-fuse 100. In the examples shown in FIGS. 13-14, drain region 118D of control transistor 170 is coupled to first (cathode) terminal 150 of e-fuse 100 via any form of IC interconnect 180, and second terminal 154 is coupled to current source 172. A source region 118S of control transistor 170 is coupled to ground. In this manner, upon activation of control transistor 170, current flows from current source 172 through e-fuse 100 to ground, causing programming of e-fuse 100, i.e., opening of fuse link 140. A bipolar transistor 158 (FIG. 2) can be similarly arranged to be control transistor 170. In other embodiments, a bipolar transistor 158 (FIG. 2) can be used as the programming source for e-fuse 100 instead of a CMOS transistor in CMOS region 112.

Figure 15:
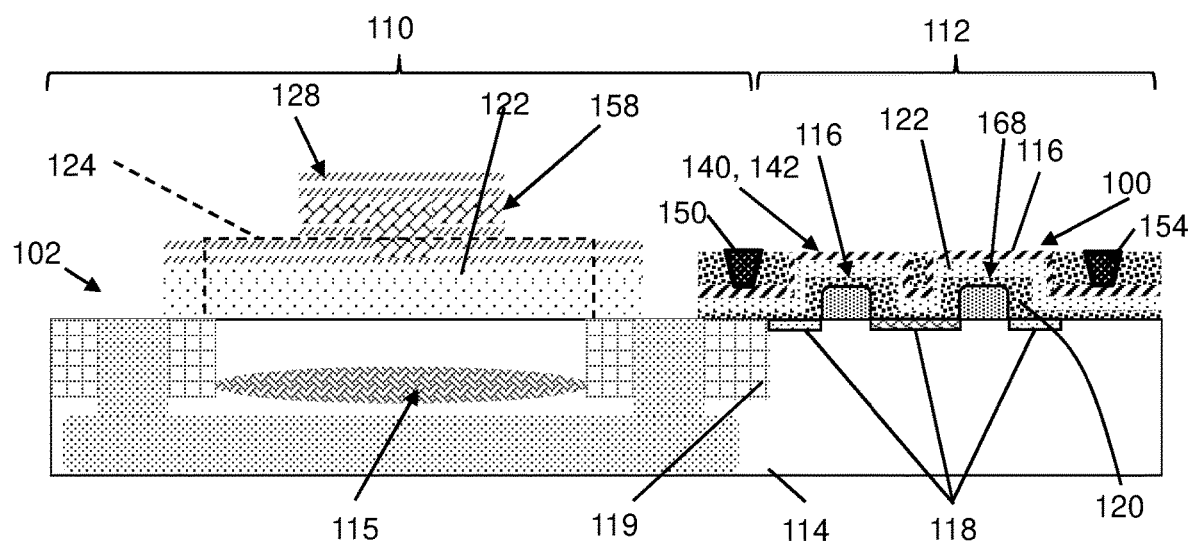
FIG. 15 shows a cross-sectional view of an integrated circuit including an e-fuse with a non-planar fuse link of silicided semiconductor, according to embodiments of the disclosure.

FIG. 15 shows a cross-sectional view of IC 102 including bipolar transistor region 110 and CMOS transistor region 112. Here, IC 102 includes bipolar transistor 158 including an intrinsic base and/or an extrinsic base (dashed box 124), and a CMOS transistor 168. IC 102 also includes e-fuse 100 including non-planar fuse link 140 including silicided semiconductor layer 142 over dielectric layer 120 covering gate conductor(s) 116. As illustrated in, for example, FIGS. 4, 6, 8, 9 and 12-14, silicided semiconductor layer 142 extends orthogonally over gate conductor(s) 116. E-fuse 100 also includes first terminal 150 electrically coupled to first end 152 of non-planar fuse link 140, and second terminal 154 electrically coupled to second end 156 of non-planar fuse link 140. Silicided semiconductor layer 142 is a same layer as at least one of intrinsic base and extrinsic base (dashed box 124) of bipolar transistor 158. In this case, silicided semiconductor layer 142 may include a dopant, which may have a dopant concentration of greater than $5E18$ atoms/$cm^3$, to accommodate the bases of bipolar transistor 158. Silicided semiconductor layer 142 may include, for example, silicon (Si) or silicon germanium (SiGe). In certain embodiments, e.g., FIGS. 13-14, gate conductor(s) 116 is part of CMOS control transistor 170 that is configured to electrically couple current source 172 to non-planar fuse link 140 for programming e-fuse 100. In other embodiments, e.g., FIG. 12, gate conductor(s) is a resistor 162, capable of heating fuse link 140 to control a programming energy. In other embodiments, non-planar fuse link 140 may include at least one turn 160 therein, as in FIGS. 9-11. Non-planar fuse link 140 may extend orthogonally over gate conductor(s) 116 more than once, as in FIG. 9. Non-planar fuse link 140, including silicided semiconductor layer 122 over dielectric layer 120, may cover a plurality of gate conductors 116 such that non-planar fuse link 140 includes a plurality of peaks and valleys. Any of the embodiments described herein can be mixed and matched to control the attributes of e-fuse 100.

Embodiments of the disclosure provide an e-fuse that may reduce the programming energy by, for example, 25-30%. The e-fuse also reduces the size of a programming current source 172, which will reduce the overall circuitry footprint by, for example, approximately 10-25%, compared to conventional planar e-fuses. As described, e-fuse 100 does not require any additional masks to implement, and a minimum size is not dependent on gate length. Where the gate conductors are used as part of the control transistor, the heat from the transistor may also potentially result in lower current for the e-fuse blow resulting in further reduction in area.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An electrical fuse (e-fuse), comprising:
a fuse link including a silicided semiconductor layer over a dielectric layer covering a gate conductor, wherein the silicided semiconductor layer is non-planar;
a first terminal electrically coupled to a first end of the fuse link; and
a second terminal electrically coupled to a second end of the fuse link.

2. The e-fuse of claim 1, wherein the silicided semiconductor layer includes a dopant.

3. The e-fuse of claim 1, wherein the silicided semiconductor layer includes one of silicon (Si) and silicon germanium (SiGe).

4. The e-fuse of claim 1, wherein the gate conductor is part of a transistor configured to electrically couple a current source to the first terminal for programming the e-fuse, the second terminal electrically coupled to ground.

5. The e-fuse of claim 1, wherein the gate conductor is non-operational.

6. The e-fuse of claim 1, wherein the gate conductor is a resistor.

7. The e-fuse of claim 1, wherein the fuse link includes at least one lateral turn therein.

8. The e-fuse of claim 7, wherein the fuse link extends orthogonally over the gate conductor more than once.

9. The e-fuse of claim 1, wherein the silicided semiconductor layer is in a same layer as at least one of an intrinsic base and an extrinsic base of a bipolar transistor.

10. The e-fuse of claim 1, wherein the fuse link includes the silicided semiconductor layer over the dielectric layer covering a plurality of gate conductors such that the fuse link includes a number of peaks and valleys.

11. The e-fuse of claim 1, wherein the silicided semiconductor layer extends orthogonally over the gate conductor.

12. An integrated circuit (IC), comprising:
a bipolar transistor including an intrinsic base and an extrinsic base;
a complementary metal-oxide semiconductor (CMOS) transistor; and
an electrical fuse (e-fuse), including:
a non-planar fuse link including a silicided semiconductor layer over a dielectric layer covering a gate conductor, wherein the silicided semiconductor layer extends orthogonally over the gate conductor;
a first terminal electrically coupled to a first end of the non-planar fuse link; and
a second terminal electrically coupled to a second end of the non-planar fuse link, wherein the silicided semiconductor layer is a same layer as at least one of the intrinsic base and the extrinsic base of the bipolar transistor.

13. The IC of claim 12, wherein the silicided semiconductor layer includes a dopant.

14. The IC of claim 12, wherein the silicided semiconductor layer includes one of silicon (Si) and silicon germanium (SiGe).

15. The IC of claim 12, wherein the gate conductor is part of the CMOS transistor, and wherein the CMOS transistor is configured to electrically couple a current source to the non-planar fuse link for programming the e-fuse.

16. The IC of claim 12, wherein the gate conductor is a resistor.

17. The IC of claim 12, wherein the non-planar fuse link includes at least one lateral turn therein.

18. The IC of claim 17, wherein the non-planar fuse link extends orthogonally over the gate conductor more than once.

19. The IC of claim 12, wherein the non-planar fuse link includes the silicided semiconductor layer over the dielectric layer covering a plurality of gate conductors such that the non-planar fuse link includes a plurality of peaks and valleys.

* * * * *